(12) United States Patent
Park

(10) Patent No.: US 7,842,615 B2
(45) Date of Patent: Nov. 30, 2010

(54) SEMICONDUCTOR DEVICE HAVING A COPPER METAL LINE AND METHOD OF FORMING THE SAME

(75) Inventor: Jeong Ho Park, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 205 days.

(21) Appl. No.: 12/169,526

(22) Filed: Jul. 8, 2008

(65) Prior Publication Data

US 2009/0026617 A1    Jan. 29, 2009

(30) Foreign Application Priority Data

Jul. 25, 2007    (KR)    ............... 10-2007-0074564

(51) Int. Cl.
*H01L 21/311* (2006.01)
(52) U.S. Cl. .................. 438/702; 257/E21.249; 257/758; 438/637; 438/700; 438/703
(58) Field of Classification Search .......... 257/E23.161, 257/E21.205, E21.249, 751, 758, 783; 438/627, 438/637–641, 696, 700, 702, 703
See application file for complete search history.

(56) References Cited

U.S. PATENT DOCUMENTS

| | | | | |
|---|---|---|---|---|
| 6,020,230 A | * | 2/2000 | Wu | 438/222 |
| 6,228,727 B1 | * | 5/2001 | Lim et al. | 438/296 |
| 6,403,486 B1 | * | 6/2002 | Lou | 438/694 |
| 6,551,925 B2 | * | 4/2003 | Iguchi et al. | 438/637 |
| 6,797,612 B2 | * | 9/2004 | Zahorik | 438/639 |
| 7,611,962 B2 | * | 11/2009 | Kwak | 438/424 |
| 2008/0029864 A1 | * | 2/2008 | Pyo et al. | 257/678 |
| 2008/0064217 A1 | * | 3/2008 | Horii | 438/703 |

* cited by examiner

*Primary Examiner*—Chris Chu
(74) *Attorney, Agent, or Firm*—Workman Nydegger

(57) ABSTRACT

A semiconductor device having a copper line and a method of forming the same so as to prevent a bridge phenomenon between neighboring upper lines are described. The method may include the steps of forming a capping layer and an intermetal dielectric layer in a stacked configuration over a substrate in which lower lines are formed, forming trenches defining an upper metal line region on the intermetal dielectric layer, and forming a spacer on inner sidewalls of the trenches. A via may then be formed under the exposed first trench using a photolithography process and the spacer for alignment. After removing the spacer, a barrier metal film may be formed on inner walls of the trenches and the via, a copper metal line film may be gap-filled within the trenches and the via, and a surface of the semiconductor device may be polished.

5 Claims, 8 Drawing Sheets

SEMICONDUCTOR DEVICE HAVING A COPPER METAL LINE AND METHOD OF FORMING THE SAME

CROSS-REFERENCE TO RELATED APPLICATION

This application claims priority to Korean Application No. 10-2007-0074564, filed on Jul. 25, 2007, which is incorporated herein by reference in its entirety.

BACKGROUND

1. Field of the Invention

Embodiments of the present invention relate to a method of forming a copper metal line of a semiconductor device and, more particularly, to a method of forming a copper metal line of a semiconductor device by employing a dual damascene process.

2. Background of the Invention

In general, when fabricating semiconductor devices, for electrical connection between elements or lines, metal lines are used. In recent years, as semiconductor devices are required to have higher integration and higher performance, copper (Cu), having more excellent electrical properties such as conductivity than aluminum (Al), is used as the material to form the metal lines.

A copper metal line is not easy to pattern through an etching process and is therefore patterned through a damascene process, instead of a subtractive patterning method that has generally been used to form aluminum metal lines. In a multi-line structure, a dual damascene process of forming a via connecting upper/lower lines and an upper metal line at the same time has been widely used.

In the dual damascene process, an intermetal dielectric layer is first deposited and formed. A dual damascene structure, comprised of trenches and a via, is formed within the intermetal dielectric layer by performing photolithography and subsequent etch processes twice. A copper film is gap-filled within the trenches and via, thereby making a polished surface. Thus, the copper film connects upper/lower lines through the via and forms an upper metal line within the trenches.

FIGS. 1a to 1i are process sectional views sequentially showing a conventional method of forming a copper metal line of a semiconductor device.

Referring first to FIG. 1a, a capping layer 120 is thinly deposited and formed on the entire upper surface of a substrate 110 in which lower lines 112 are formed. The capping layer 120 prevents metal atoms of the lower lines 112 from out-diffusing into an intermetal dielectric layer 130 subsequently formed over the capping layer 120 on the upper side.

The lower lines 112 defining a lower line region may be formed within the substrate 110 by forming trenches, gap-filling the trenches with a copper film, and polishing the resulting surface.

The capping layer 120 may be formed of silicon nitride (SiN, Si3N4) or other material having a hard film quality characteristic.

Referring next to FIG. 1b, the intermetal dielectric layer 130 is deposited and formed on the entire surface of the capping layer 120. The corresponding intermetal dielectric layer 130 functions to provide insulation between upper and lower lines, and may be formed of material with a low dielectric constant (low-k), such as a silicon oxide ($SiO_2$) film, a doped silicon oxide film, or a fluorinated silica glass (FSG) film.

Referring next to FIG. 1c, a first photoresist pattern 140, having a first through-hole 140a at a location corresponding to a specific lower line 112, is formed on the intermetal dielectric layer 130 through, e.g., a typical photolithography process.

The photolithography process may comprise a series of processes, such as photoresist coating, exposure, and development.

Referring next to FIG. 1d, portions of the intermetal dielectric layer 130 and the capping layer 120 that are exposed by the first through-hole 140a of the first photoresist pattern 140 are removed by performing etching using the first photoresist pattern 140 as a mask. As a result, a via 132 may be vertically formed through which a surface of the lower line 112 is exposed.

The first photoresist pattern 140 is then removed through, e.g., an ashing process or the like.

Referring to FIG. 1e, a second photoresist pattern 150, having a second set of through-holes 150a defining an upper line region, is formed on the intermetal dielectric layer 130 through, e.g., a photolithography process. Each of the through-holes 150a may have a larger width than that of the via 132.

Referring to FIG. 1f, exposed upper portions of the intermetal dielectric layer 130 corresponding to the second set of through-holes 150a of the second photoresist pattern 150, are removed to a specific predetermined depth. The exposed portions are removed by performing etching using the second photoresist pattern 150 as a mask, thus forming trenches 134.

When forming the via 132 and the trenches 134 a dry etching process, such as reactive ion etching (RIE) which has an anisotropic characteristic, may be used.

Under certain conditions, the inside of the via 132 may become gap-filled with the second photoresist film. However, under such conditions a trench 134 can still be formed over the via 132. As shown in the drawings, the trenches 134 are formed not only on the via 132, but also on a portion in which the via 132 is not formed.

Upon forming the trenches 134, the second photoresist pattern 150 is removed through, e.g., an ashing process or the like.

Accordingly, a dual damascene structure, having the trenches 134 on the upper side and the via 132 on the lower side, is formed.

Although the via etching process described above removes the exposed portions of both the intermetal dielectric layer 130 and the capping layer 120 at the same time (see FIG. 1d), the via 132 may instead be formed only within the intermetal dielectric layer 130, leaving the capping layer 120 temporarily intact. Then, after the trenches 134 are formed (see FIG. 1f), the portion of the capping layer 120 corresponding to the via 132 may be removed by a separate etching process.

Referring to FIG. 1g, a barrier metal film 160 is thinly deposited and formed on the entire surface, including inner walls of the via 132 and the trenches 134. The barrier metal film 160 functions to prevent copper atoms from diffusing when a copper metal line film 170 is subsequently formed, and may be made of, for example, tantalum (Ta) or tantalum nitride (TaN).

Referring to FIG. 1h, the copper metal line film 170 is fully gap-filled within the barrier metal film-coated via 132 and trenches 134 through, e.g., an electro chemical plating (ECP) process, so that the copper metal line film 170 is connected to the lower line 112. The ECP method has an excellent gap-filling characteristic, among other desirable physical properties.

Referring to FIG. 1i, the copper metal line film 170 and the barrier metal film 160, which are over-filled on the intermetal dielectric layer 130, are removed through a chemical mechanical polishing (CMP) process, thereby completing a copper metal line.

A surface of the copper metal line film 170 may then be polished, and a capping layer (not shown) may be deposited and formed on the entire surface of the copper metal line film 170.

Accordingly, the upper and lower lines are connected through the copper metal line film 170 within the via 132, and an upper line is formed with the copper metal line film 170 within the trenches 134.

However, the conventional copper metal line formation method has a number of problems.

For example, as shown in the scanning electron microscope (SEM) photograph of FIG. 2, the via 132 in contact with the lower line 112 can be misaligned (e.g., shifted to one side) relative to the lower line 112. Such misalignment can result from a mask alignment failure, for example, during the photolithography process. The trenches 134 can also be misaligned relative to the via 132 and/or the lower line 112. Therefore, a bridge phenomenon 'B' in which neighboring upper lines are interconnected can result.

If this bridge phenomenon 'B' occurs, a power short can occur upon subsequent use, which results in abrupt power loss, among other undesirable consequences. Accordingly, semiconductor devices with conventionally formed copper metal lines can have significantly degraded reliability.

SUMMARY OF SOME EXAMPLE EMBODIMENTS

In general, example embodiments of the invention relate to a method of forming a copper metal line of a semiconductor device by first forming upper line trenches and then a via to a lower line (as opposed to conventional methods that form the via first) and by forming a spacer on inner sidewalls of the trenches. As a result, a bridge phenomenon in the upper line can be prevented, among other things.

A method of forming a copper metal line of a semiconductor device in accordance with an embodiment may include the steps of forming a capping layer and an intermetal dielectric layer in a stacked configuration over a substrate in which lower lines are formed; forming trenches, defining an upper metal line region, on the intermetal dielectric layer through etching employing a first photoresist pattern; forming a spacer on inner sidewalls of the trenches; forming a second photoresist pattern for exposing a first one of the trenches while covering a second one of the trenches and performing etching so as to remove the intermetal dielectric layer exposed by the spacer, thereby forming a via under the exposed first trench; removing the spacer; forming a barrier metal film on inner walls of the trenches and the via; and gap-filling a copper metal line film within the trenches and the via and polishing a surface of the semiconductor device.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF SOME EXAMPLE EMBODIMENTS

Figure 1A:
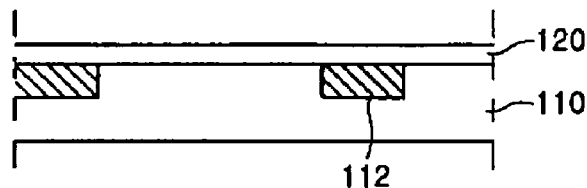
FIGS. 1a to 1i are process sectional views sequentially showing a method of forming a copper metal line of a semiconductor device according to a conventional technology.
Figure 1B:
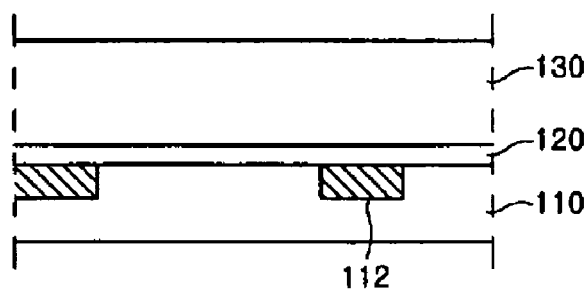
Figure 1C:
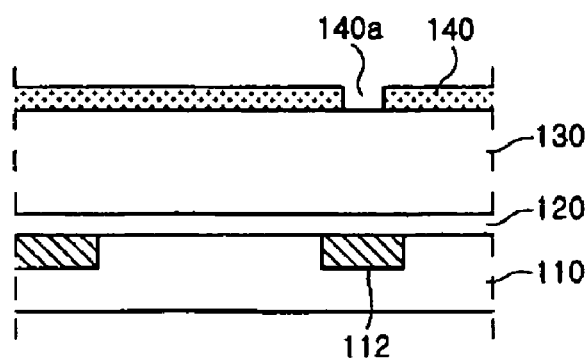
Figure 1D:
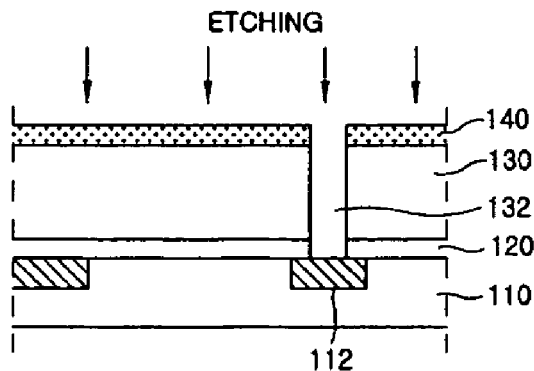
Figure 1E:
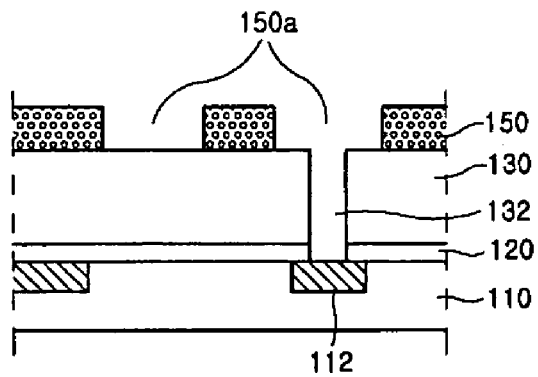
Figure 1F:
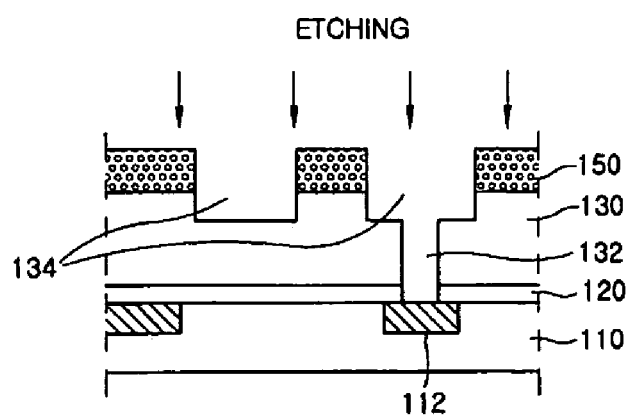
Figure 1G:
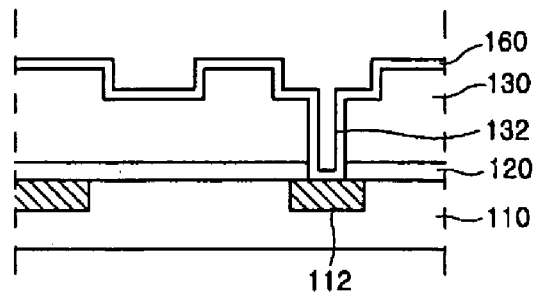
Figure 1H:
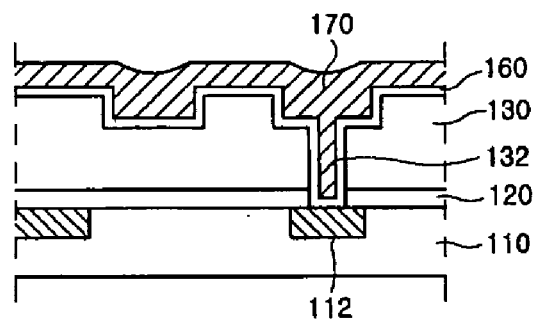
Figure 1I:
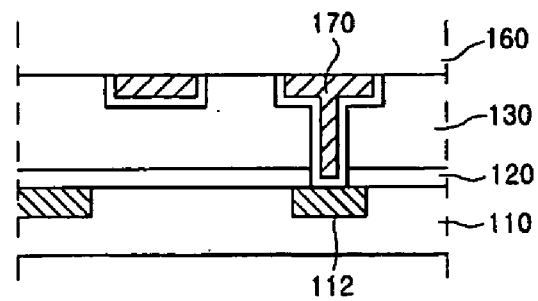
Figure 2:
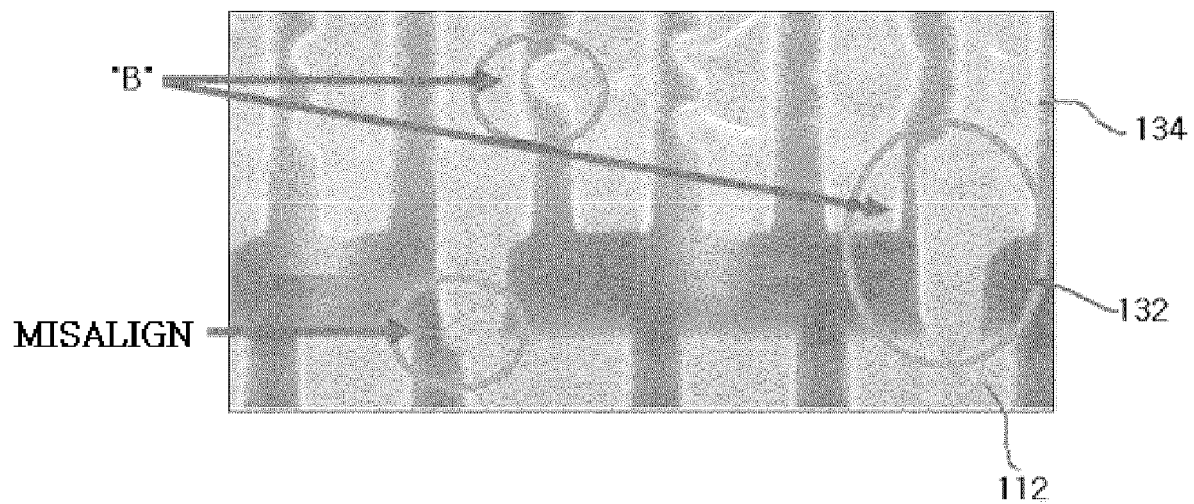
FIG. 2 is a SEM photograph showing a bridge phenomenon in which neighboring upper lines are interconnected when forming a copper metal line of a semiconductor device according to a conventional technology.

In the following detailed description of the embodiments, reference is made to the accompanying drawings that show, by way of illustration, specific embodiments of the invention. In the drawings, like numerals describe substantially similar components throughout the several views. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

A copper metal line may be patterned using a damascene process. In a multi-line structure, a dual damascene process may be employed to form a via, connecting upper and lower lines, and an upper line at the same time.

The dual damascene process refers to a process of forming a dual damascene structure, comprised of a via and trenches, within an intermetal dielectric layer by performing photolithography processes twice and gap-filling the via and the trenches with copper (Cu). Accordingly, the copper film connects the upper and lower lines through the via and forms an upper line within the trench.

FIGS. 3a to 3i are process sectional views sequentially showing a method of forming a copper metal line of a semiconductor device in accordance with an exemplary embodiment of the present invention.

Figure 3A:
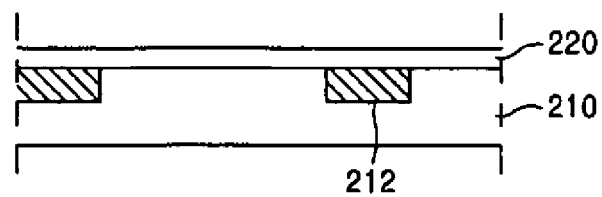
FIGS. 3a to 3i are process sectional views sequentially showing a method of forming a copper metal line of a semiconductor device in accordance with an embodiment of the present invention.

Referring first to FIG. 3a, a capping layer 220 may be thinly deposited and formed on the entire upper surface of a substrate 210 in which lower lines 212 are formed. The capping layer 220 functions to prevent metal atoms of the lower lines 212 from out-diffusing into an intermetal dielectric layer 230 to be subsequently formed on the upper side.

The lower lines 212 defining a lower line region may be formed within the substrate 210 by forming trenches, gap-filling the trenches with a copper film, and polishing the resulting surface.

The capping layer 220 may be formed of silicon nitride (SiN, $Si_3N_4$) or other material having a hard film quality characteristic.

Figure 3B:
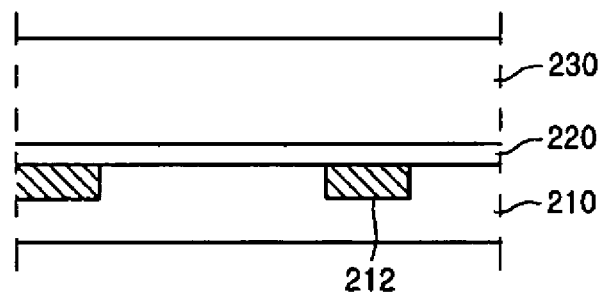

The intermetal dielectric layer 230 may be deposited and formed on the entire surface of the capping layer 220, as shown in FIG. 3b. The corresponding intermetal dielectric layer 230 functions to provide insulation between upper and lower lines, and may be formed of material with a low dielectric constant (low-k), such as a silicon oxide ($SiO_2$) film, a doped silicon oxide film, or a fluorinated silica glass (FSG) film.

Figure 3C:
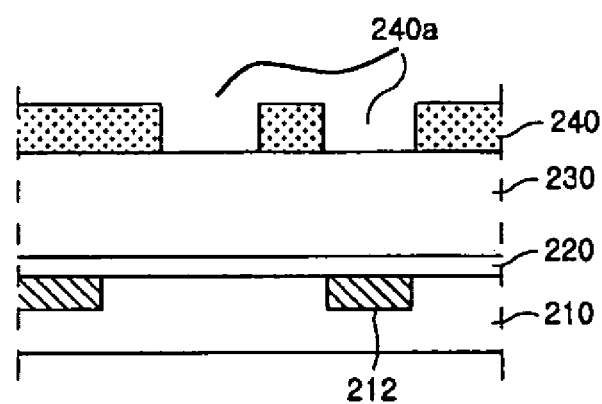

A first photoresist pattern 240, having a first set of through-holes 240a to define an upper line region, may be formed on the intermetal dielectric layer 230 through a photolithography process, as shown in FIG. 3c. The photolithography process may comprise a series of processes, such as photoresist coating, exposure, and development.

Figure 3D:
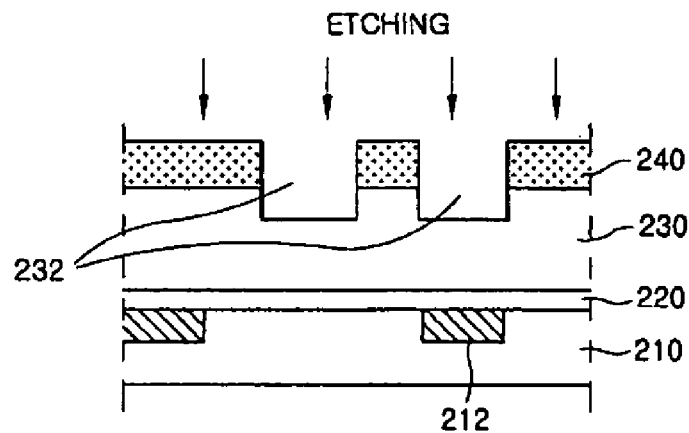

Referring next to FIG. 3d, trenches 232 may be formed by removing, to a specific predetermined depth, exposed portions of an upper side of the intermetal dielectric layer 230 corresponding to the first set of through-holes 240a of the first photoresist pattern 240. The exposed portions may be removed by performing etching using the first photoresist pattern 240 as a mask.

Etching may be performed using a dry etching process having an anisotropic characteristic, such as RIE. As shown in the drawings, the trenches 232 are formed not only at a location that coincides with the location of an upper to lower line via 234 to be formed subsequently, but also at one or more other non-via locations where no connection between upper and lower lines is needed.

The first photoresist pattern 240 may then be removed through, e.g., an ashing process or the like.

Figure 3E:
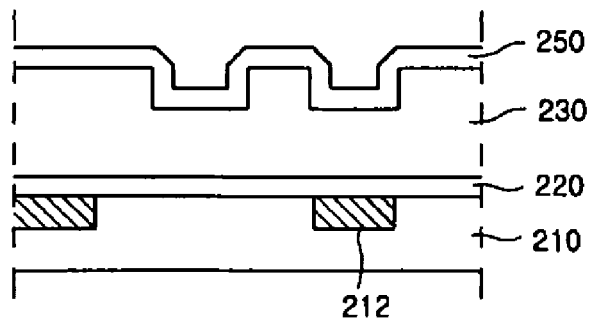

A spacer film 250 for forming a spacer may then be formed to a specific thickness on the entire resulting surface, including the formed trenches 232, as shown in FIG. 3e. The spacer film 250 may be formed of a nitride film in the same or similar manner as the capping layer 220.

Figure 3F:
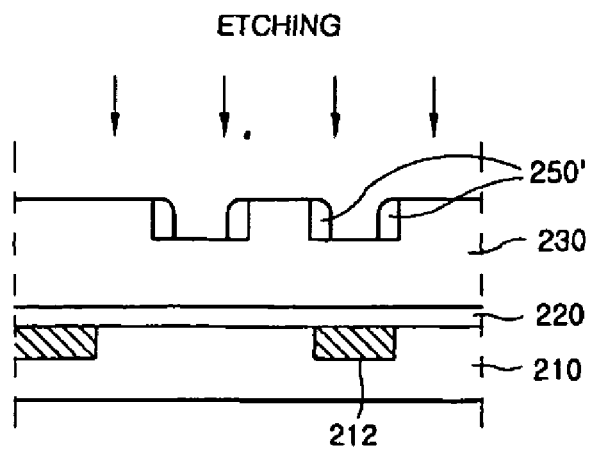

A blanket etch process may then be performed on the spacer film 250, as shown in FIG. 3f, so that the spacer film 250 is entirely removed uniformly. Consequently, a spacer 250', remaining only on inner sidewalls of the trenches 232 to a specific thickness, is formed. The blanket etch process may be performed so as to fully remove the spacer film 250 accumulated on bottom surfaces of the trenches 232, thereby forming the spacer 250'.

Figure 3G:
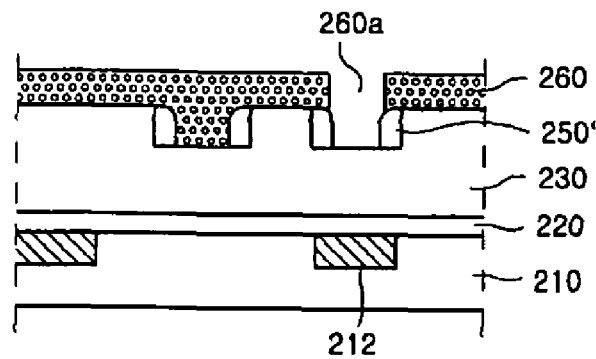

As shown in FIG. 3g, a second photoresist pattern 260 may be formed through a photolithography process. The second photoresist pattern 260 has a second through-hole 260a for exposing the trench 232 corresponding to the via 234 to be formed on its bottom surface while covering the trench 232 that does not correspond to the via 234.

The second through-hole 260a of the second photoresist pattern 260 may be formed such that its edge is positioned over the spacer 250' within the trench 232. Preferably, the second through-hole 260a can be formed to have its edge lie substantially midway along the width of the spacer 250' to allow for as much process margin as possible.

Figure 3H:
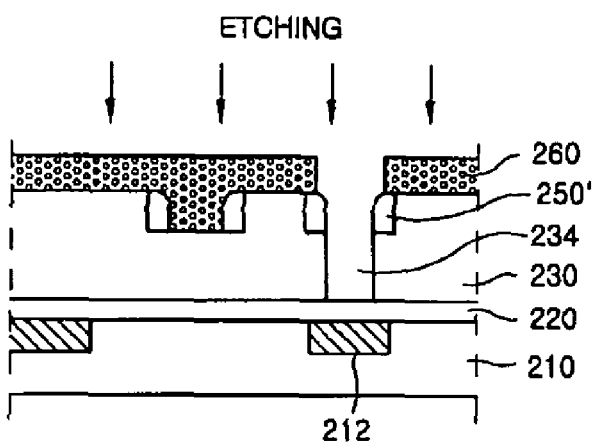

Referring next to FIG. 3h, the via 234 may be vertically formed by removing the exposed intermetal dielectric layer 230 through etching, employing the spacer 250' within the trench 232, which is exposed by the second through-hole 260a of the second photoresist pattern 260, as a mask. The etching may be carried out until a surface of the capping layer 220 is exposed.

The etching may be performed using a dry etching process having an anisotropic characteristic, such as RIE.

The second photoresist pattern 260 may then be removed through, e.g., an ashing process or the like.

Figure 3I:
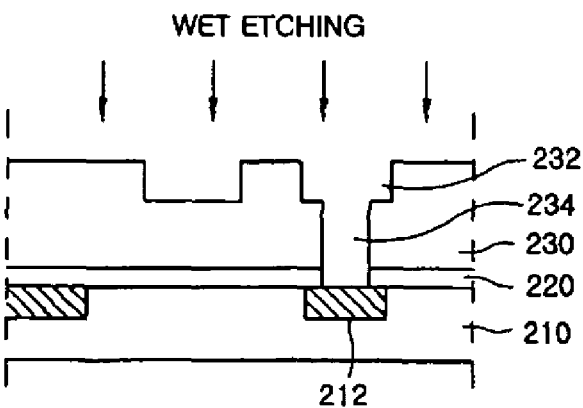

The spacer 250' and the region of the capping layer 220 corresponding to the via 234 may be fully removed at the same time, as shown in FIG. 3i. Since the spacer 250' and the capping layer 220 may be formed of the same nitride film, they can be removed at the same time through wet etch employing a phosphoric acid ($H_3PO_4$) solution, which can easily remove the nitride film selectively, as an etchant.

Accordingly, the via (234) region of the capping layer 220 may be completely removed, so that the surface of the lower line 212 is exposed by the fully penetrating via 234.

A dual damascene structure, comprising the trenches 232 on an upper side and the via 234 on a lower side, may thereby be formed.

Figure 3J:
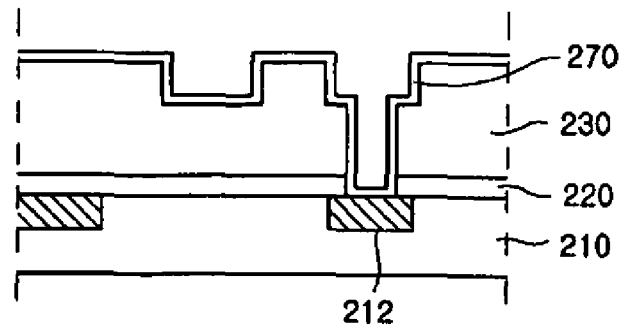

Referring to FIG. 3j, a barrier metal film 270 may be thinly deposited and formed on the entire surface, including inner walls of the via 234 and the trenches 232. The barrier metal film 270 functions to prevent copper atoms from diffusing when a copper metal line film 280 is subsequently formed, and may be made of, e.g., tantalum (Ta) or tantalum nitride (TaN).

Figure 3K:
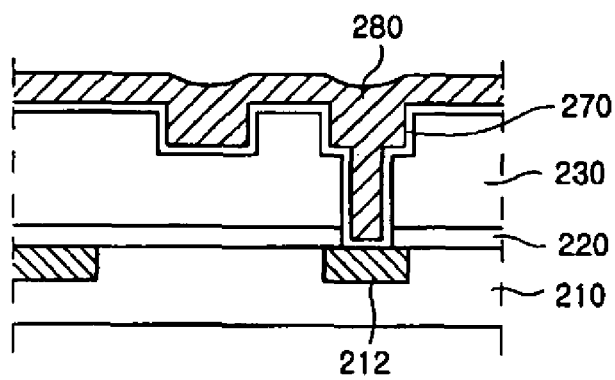

Referring to FIG. 3k, the copper metal line film 280 may be fully gap-filled within the barrier metal film-coated via 234 and trenches 232 through, e.g., an electro chemical plating (ECP) process, so that the copper metal line film 280 is connected to the lower line 212.

The ECP method has an excellent gap-filling characteristic, among other desirable physical properties. However, the copper metal line film 280 may be formed using a method other than the ECP method.

Further, before the copper metal line film 280 is gap-filled, a thin copper seed layer (not shown) may first be formed on the barrier metal film 270 (by employing, e.g., deposition or the ECP method) in order to more smoothly form the copper metal line film 280.

Further, after the copper metal line film 280 is formed, in order to mitigate stress within and increase density of the copper metal line film 280, an annealing heat treatment may be carried out.

Figure 3L:
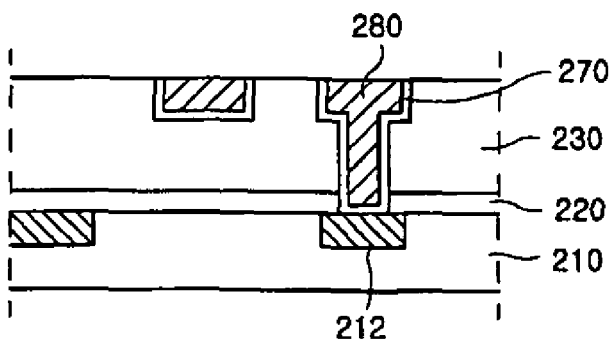

Referring to FIG. 3l, the copper metal line film 280 and the barrier metal film 270, which are over-filled on the intermetal dielectric layer 230, may be removed through a chemical mechanical polishing (CMP) process, thereby completing a copper metal line.

A surface of the copper metal line film 280 may then be polished, and a capping layer (not shown) may be deposited and formed on the entire surface of the copper metal line film 280.

Accordingly, the upper and lower lines are connected through the copper metal line film 280 within the via 234, and an upper line is formed with the copper metal line film 280 within the trenches 232.

In summary, in the prior art, the process of forming copper metal lines is performed by forming the via first, then the corresponding trench. In embodiments of the present invention, however, the process is performed in a reverse order, i.e., by forming the trenches before the via. Further, a spacer 250' is formed on the inner sidewalls of the trenches 232, and the via 234 is formed using the corresponding spacer 250' to achieve substantial alignment with the corresponding trench 232.

As described above, the trenches 232 are first formed and the spacer 250' is employed. Accordingly, occurrence of the bridge phenomenon, in which neighboring upper lines formed within the trenches 232 are interconnected due to misalignment, can be prevented, among other things. Accordingly, by applying the methods and techniques described above, the yield of semiconductor devices can be improved, a stable process can be performed, and reliability of semiconductor devices can be improved.

While the invention has been shown and described with respect to the preferred embodiments, it will be understood by those skilled in the art that various changes and modifications may be made without departing from the spirit and scope of the invention as defined in the following claims.

What is claimed is:

1. A method of forming a copper metal line of a semiconductor device, the method comprising the steps of:
    forming a capping layer and an intermetal dielectric layer in a stacked configuration over a substrate in which lower lines are formed;
    forming trenches, defining an upper metal line region, on the intermetal dielectric layer through etching employing a first photoresist pattern;
    forming a spacer on inner sidewalls of the trenches;
    forming a second photoresist pattern for exposing a first one of the trenches while covering a second one of the trenches and performing etching so as to remove the intermetal dielectric layer exposed by the spacer, thereby forming a via under the exposed first trench;
    removing the spacer;
    forming a barrier metal film on inner walls of the trenches and the via; and
    gap-filling a copper metal line film within the trenches and the via and polishing a surface of the semiconductor device.

2. The method of claim 1, wherein a through-hole formed in the second photoresist pattern to expose the first one of the trenches has an edge located substantially midway along a width of the spacer formed on the inner sidewalls of the first one of the trenches.

3. The method of claim 1, wherein the spacer and the capping layer are formed of the same or similar materials, such that the spacer and the capping layer can be removed using the same etchant.

4. The method of claim 3, wherein the spacer and the capping layer are formed of a nitride film.

5. The method of claim 4, wherein the spacer and the capping layer are removed at the same time through a wet etch process employing a phosphoric acid solution.

* * * * *